(12) United States Patent
Perälä et al.

(10) Patent No.: US 10,629,573 B2
(45) Date of Patent: Apr. 21, 2020

(54) DISPLAY DEVICE WITH DIFFERENT SIZE SUBPIXELS AND OPERATING METHOD FOR SUCH A DISPLAY DEVICE

(71) Applicant: OSRAM OLED GmbH, Regensburg (DE)

(72) Inventors: Mikko Perälä, Tegernheim (DE); Hubert Halbritter, Dietfurt (DE); Jens Richter, Hemau (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/221,367

(22) Filed: Dec. 14, 2018

(65) Prior Publication Data

US 2019/0189044 A1 Jun. 20, 2019

(30) Foreign Application Priority Data

Dec. 14, 2017 (DE) .......................... 10 2017 129 981

(51) Int. Cl.
*H01L 25/10* (2006.01)
*H01L 27/15* (2006.01)
(Continued)

(52) U.S. Cl.
CPC ......... *H01L 25/105* (2013.01); *G09G 3/2074* (2013.01); *G09G 3/32* (2013.01);
(Continued)

(58) Field of Classification Search
CPC ...... G09G 3/2003; G09G 3/32; G09G 3/2074; G09G 2300/0452; G09G 2320/064;
(Continued)

(56) References Cited

U.S. PATENT DOCUMENTS

2007/0146242 A1\* 6/2007 Miller .................. G09G 3/2074
345/76
2010/0117997 A1 5/2010 Haase
(Continued)

FOREIGN PATENT DOCUMENTS

EP 2549330 A1 1/2013
EP 3144972 A1 3/2017
(Continued)

OTHER PUBLICATIONS

Wikipedia, "4K resolution," pp. 1-12, downloaded: Nov. 12, 2018, https://en.wikipedia.org/wiki/4K_resolution.
(Continued)

*Primary Examiner* — Darlene M Ritchie
(74) *Attorney, Agent, or Firm* — Slater Matsil, LLP (57) ABSTRACT

A display device and a method for operating a display device are disclosed. In an embodiment a display device includes a plurality of image points configured for emitting visible light of adjustable color by at least one semiconductor layer sequence, wherein the image points are independently controllable of one another, wherein each of the image points includes a plurality of types of pixels and each type of pixel is configured to emit light of a particular color, wherein the pixels are independently controllable of one another, wherein each of the pixels is divided into a plurality of subpixels, the subpixels being independently controllable of one another within the associated pixel, and wherein all subpixels of the associated pixel are configured for emitting light of the same color from the display device without further color change.

13 Claims, 5 Drawing Sheets

(51) Int. Cl.
*G09G 3/20* (2006.01)
*G09G 3/32* (2016.01)
*H01L 25/075* (2006.01)

(52) U.S. Cl.
CPC ... *H01L 27/156* (2013.01); *G09G 2300/0452* (2013.01); *G09G 2320/064* (2013.01); *G09G 2320/066* (2013.01); *G09G 2320/0626* (2013.01); *H01L 2225/1005* (2013.01)

(58) Field of Classification Search
CPC ..... G09G 2320/0626; G09G 2320/066; G09G 3/3208; G09G 3/3225; G09G 3/3233; G09G 3/3406; G09G 3/3413; H01L 27/156; H01L 25/10; H01L 25/105; H01L 25/115; H01L 2225/1005
See application file for complete search history.

(56) References Cited

U.S. PATENT DOCUMENTS

| | | | | |
|---|---|---|---|---|
| 2015/0331285 A1* | 11/2015 | Bibl | ............... | G02F 1/133603 362/84 |
| 2015/0332635 A1* | 11/2015 | Lau | ............... | H01L 33/24 345/691 |
| 2015/0339972 A1* | 11/2015 | Xu | ............... | G09G 3/3225 345/206 |
| 2015/0362165 A1* | 12/2015 | Chu | ............... | H01L 25/0753 362/235 |
| 2015/0379924 A1* | 12/2015 | Matsueda | ............... | G09G 3/3208 345/690 |
| 2017/0061842 A1* | 3/2017 | Cok | ............... | G09G 3/2003 |
| 2017/0179192 A1* | 6/2017 | Zhang | ............... | H01L 25/16 |
| 2017/0294479 A1* | 10/2017 | Cha | ............... | H01L 25/0655 |
| 2017/0323592 A1* | 11/2017 | Hughes | ............... | G09G 3/2088 |
| 2018/0358339 A1* | 12/2018 | Iguchi | ............... | G09F 9/33 |
| 2019/0073944 A1* | 3/2019 | Li | ............... | G09G 3/32 |
| 2019/0088724 A1* | 3/2019 | Do | ............... | H01L 33/504 |
| 2019/0148409 A1* | 5/2019 | Bang | ............... | H01L 27/124 345/173 |

FOREIGN PATENT DOCUMENTS

| | | | | |
|---|---|---|---|---|
| WO | 2017001760 A1 | 1/2017 | | |
| WO | WO-2017001760 A1 * | 1/2017 | ........... | H01L 33/504 |

OTHER PUBLICATIONS

Wikipedia, "High-dynamic-range imaging," pp. 1-10, downloaded: Nov. 12, 2018, https://en.wikipedia.org/wiki/High-dynamic-range_imaging.

* cited by examiner

DISPLAY DEVICE WITH DIFFERENT SIZE SUBPIXELS AND OPERATING METHOD FOR SUCH A DISPLAY DEVICE

CROSS-REFERENCE TO RELATED APPLICATIONS

This application claims the benefit of German patent application 102017129981.5, filed on Dec. 14, 2017, which application is hereby incorporated herein by reference.

TECHNICAL FIELD

The invention relates to a display device. The invention further relates to an operating method for a display device.

SUMMARY

Embodiments provide a display device with which images can be reproduced with a high contrast.

According to at least one embodiment, the display device comprises a plurality of image points. The image points are each configured to variably emit colored visible light. This means that, depending on a control, the image points can emit colored light such as red, green or blue light or also mixed-colored light such as white light. Furthermore, an intensity of the light emitted by the image points during operation can be adjusted.

According to at least one embodiment, a light generation in the image points is based on at least one semiconductor layer sequence. This means that the display device is a semiconductor light source. The semiconductor layer sequence is preferably formed from inorganic materials.

The semiconductor layer sequence is preferably based on a III-V compound semiconductor material. The semiconductor material is, for example, a nitride compound semiconductor material such as $Al_n In_{1-n-m} Ga_m N$ or a phosphide compound semiconductor material such as $Al_n In_{1-n-m} Ga_m P$ or also an arsenide compound semiconductor material such as $Al_n In_{1-n-m} Ga_m As$ or as $Al_n Ga_m In_{1-n-m} As_k P_{1-k}$, wherein in each case $0 \leq n \leq 1$, $0 \leq m \leq 1$ and $n+m \leq 1$ and $0 \leq k < 1$. Preferably, the following applies to at least one layer or to all layers of the semiconductor layer sequence: $0 < n \leq 0.8$, $0.4 \leq m < 1$ and $n+m \leq 0.95$ and $0 < k \leq 0.5$. The semiconductor layer sequence can comprise dopants and additional components. For the sake of simplicity, however, only the essential components of the crystal lattice of the semiconductor layer sequence are mentioned, that is Al, As, Ga, In, N or P, even if these can be partially replaced and/or supplemented by small quantities of further substances.

According to at least one embodiment, the image points can be controlled independently of one another. Thus, an image can be displayed in a temporally variable manner via the image points. In this way, films or videos can be displayed via the display device. For example, the display device is a display, a television apparatus or a video wall.

According to at least one embodiment, each of the image points has a plurality of types of pixels. In this case, each type of pixels is designed to emit light of a particular color. Preferably, exactly three types of pixels are present in each image point. The image points have exactly one pixel of each type, for example. Alternatively, it is possible for a plurality of pixels of one type to be present for generating green light, for example.

According to at least one embodiment, the pixels can be controlled independently of one another. The color impression of the light generated by the respective image point during operation can be adjusted by means of the different control of the pixels.

According to at least one embodiment, the pixels are each divided into a plurality of subpixels which can be controlled independently of one another. All subpixels of a pixel are designed to emit light of the same color. This means that the subpixels of a pixel do not differ or do not differ significantly from each other with regard to their emitted light spectrum.

According to at least one embodiment, all subpixels are configured to emit light of the same color out of the display device. This means that the light of the subpixels is emitted by the display device without further color change. This means that no further phosphors for a color change follow the subpixels. Preferably, also no color filters are assigned optically downstream. At most, absorption of small parts of the light takes place, for example, by means of material impurities, wherein no color change is intended with such subordinate light losses.

In at least one embodiment, the display device comprises a plurality of image points for variably emitting visible light in different colors by means of at least one semiconductor layer sequence. The image points can be controlled independently of one another. Each of the image points has a plurality of types of pixels and each type of pixels is designed to emit light of a particular color. The pixels can be controlled independently of one another and are each divided into a plurality of subpixels which can be controlled independently of one another. All subpixels within a pixel are configured for emitting light of the same color from the display device without further color change.

By dividing the pixels into subpixels, a high contrast ratio can be achieved between the image points, with comparatively simple control at the same time.

In display devices, increasingly higher image resolutions are desired, in particular in the standards 4K and UHD. In this case, not only the image resolution is to be increased, but also the accessible color space and the dynamic range. In particular, high-contrast images (High Dynamic Range Images or HDRI for short, also referred to as HDR pictures) are to be able to be presented. HDR means in particular that a contrast ratio between bright and dark areas of the display device is particularly large and pronounced. This means that display devices for HDR have to be able to produce a lighter white and a darker black. An ideal black is generated in particular by completely switching off an image point. This is only possible with LEDs or OLEDs, but not with liquid crystal masks, LCDs for short.

High brightnesses can be achieved in particular using a direct LED technology, since inorganic semiconductor layer sequences can generate high light intensities with a small luminous area, in contrast to what is the case, for example, in OLEDs or LCDs. Thus, brightnesses in the range of 6000 $cd/m^2$ or up to 10 000 $cd/m^2$ can be achieved, particularly in the field of outdoor applications, for example, for video walls. In order to achieve these high brightnesses, the individual pixels of the LEDs must have a certain minimum size. If larger LED chips are used, the efficiency is maximized and the LED chips can be operated at higher currents than smaller chips. If, however, semiconductor layer sequences are optimized for high current densities, the efficiency usually decreases significantly at relatively low current densities, and it is possible that an unexpected behavior occurs, for example, that a linearity for the brightness adjustment is lost.

A further problem with comparatively large LED chips or pixels is that in the case of pulse width modulation, PWM for short, drive pulses can be realized only down to a certain minimum time. Shorter turn-on times or minimum times can be realized technically only with a disproportionately large effort. As a result, the current intensity is usually changed in addition to the pulse duration, in order to achieve a comparatively low brightness. However, the change in the current density results in an additional calibration effort.

In the display device described here, the individual pixels are subdivided into the subpixels, as a result of which improved controllability, in particular by means of PWM, especially with equal current intensities in the individual current pulses, is possible. As a result, the dynamic range is increased and higher contrasts can be represented, with comparatively little control effort.

In general, the image points are formed by RGB pixels so that one pixel for generating red light, one pixel for generating green light and one pixel for generating blue light are present. In the display device described here, these pixels are divided into subpixels of equal size or of different sizes, instead of using only one electrically coherent light-emitting surface. This makes it possible to increase the control dynamics of the image points relative to conventional RGB image points.

In this case, it is possible for a control unit, in particular a control IC, to be applied directly to the light-generating semiconductor layer sequence. Such intermediate carriers, on which the semiconductor layer sequence can be located, can be formed either by thin-film transistors, also referred to as TFTs, or can be produced in silicon CMOS technology and optionally mounted on a larger support. TFTs are preferably used in larger display devices, silicon CMOS drivers are preferred in the case of smaller display devices, also referred to as microdisplays.

With the display device described here, it is thus possible to achieve high brightnesses of the image points when all subpixels are switched on and are operated at high current densities. Furthermore, a very low brightness can be achieved if only one or some of the subpixels are switched on and are operated with short switch-on times and/or with a low average current density. As a result, a dynamic range can be increased, in particular if the subpixels have different sizes. By direct generation of the light in the pixels without using an LCD, a deep black can also be efficiently achieved by switching off all subpixels.

This design of the pixels has the advantage, in particular, that a minimum pulse width of the PWM can be increased and/or that only a single, comparatively high current intensity is required for driving purposes. This significantly reduces the calibration effort which would otherwise be necessary for each current intensity involved. Due to the reduced calibration complexity, a required memory is also reduced, and less computing effort is required in the preprocessing of control data.

In addition, it is possible to use such a display device with subdivision into the subpixels for calibration purposes.

If all pixels are attached to the same active substrate, reference structures such as photodetectors and devices for temperature compensation can also be used together.

According to at least one embodiment, the image points each comprise one or more pixels for generating red light, for generating green light and for generating blue light. In particular, exactly one pixel each for red, green and blue light is present. The image points can thus be realized as RGB image points.

According to at least one embodiment, the semiconductor layer sequences of the different types of pixels each have an active zone for generating the light of the respective color. This means that the red, green and blue light is generated during operation by means of electroluminescence. The semiconductor layer sequences for producing blue and green light are preferably based on InGaN, and the semiconductor layer sequence for red light is preferably based on AlInGaP.

According to at least one embodiment, the semiconductor layer sequences of the different types of pixels are identical in each case, within the scope of the production tolerances. This means that the semiconductor layer sequences of the different types of pixels are designed for generating light of only one certain color, for example, for generating blue light or also for generating near ultraviolet radiation, in particular with a wavelength of maximum intensity of at least 360 nm or 395 nm and/or of at most 420 nm or 410 nm.

According to at least one embodiment, at least the pixels emitting red and green are each provided with a phosphor so that at least the red light and the green light are generated in operation by means of photoluminescence. Optionally, a phosphor for generating blue light can also be present, if the active zone of the relevant semiconductor layer sequence emits near ultraviolet radiation.

The at least one phosphor is preferably selected from the following group: $Eu^{2+}$-doped nitrides such as $(Ca,Sr)AlSiN_3:Eu^{2+}$, $Sr(Ca,Sr)Si_2Al_2N_6:Eu^{2+}$, $(Sr,Ca)AlSiN_3*Si_2N_2O:Eu^{2+}$, $(Ca,Ba,Sr)_2Si_5N_8:Eu^{2+}$, $(Sr,Ca)[LiA1_3N_4]:Eu^{2+}$; garnets from the general system $(Gd,Lu,Tb,Y)_3(Al,Ga,D)_5(O,X)_{12}$:RE where X=halide, N or divalent element, D=trivalent or tetravalent element and RE=rare earth metals, such as $Lu_3(Al_{1-x}Ga_x)_5O_{12}:Ce^{3+}$, $Y_3O_{1-x}Ga_x)_5O_{12}:Ce^{3+}$; $Eu^{2+}$-doped sulphides such as $(Ca,Sr,Ba)S:Eu^{2+}$; $Eu^{2+}$-doped SiONs such as $(Ba,Sr,Ca)Si_2O_2N_2:Eu^{2+}$; SiAlONs from the system $Li_xM_yLn_zSi_{12-(m+n)}Al_{(m+n)}O_nN_{16-n}$; beta-SiAlONs from the system $Si_{6-x}Al_zO_yN_{8-y}:RE_z$ with RE=rare earth metals; nitrido orthosilicates such as $AE_{2-x-a}RE_xEu_aSiO_{4-x}N_x$ or $AE_{2-x-a}R-E_xEu_aSi_{1-y}O_{4-x-2y}N_x$ with RE=rare earth metal and AE=alkaline earth metal or as $(Ba,Sr,Ca,Mg)_2SiO_4:Eu^{2+}$; chlorosilicates such as $Ca_8Mg(SiO_4)_4Cl_2:Eu^{2+}$; chlorophosphates such as $(Sr,Ba,Ca,Mg)_{10}(PO_4)_6Cl_2:Eu^{2+}$; BAM phosphors from the $BaO$—$MgO$—$Al_2O_3$ system such as $BaMgAl_{10}O_{17}:Eu^{2+}$; halophosphates such as $M_5(PO_4)_3(Cl,F):(Eu^{2+},Sb^{2+},Mn^{2+})$; SCAP phosphors such as $(Sr,Ba,Ca)_5(PO_4)_3Cl:Eu^{2+}$. The phosphors specified in the publication EP 2 549 330 A1 can also be used. With regard to the phosphors used, the disclosure content of this publication is incorporated by reference. In addition, so-called quantum dots can also be used as a converter material. Quantum dots in the form of nanocrystalline materials, which comprises a group II-VI compound and/or a group III-V compound and/or a group IV-VI compound and/or metal nanocrystals, are preferred.

Quantum dots are preferably used as phosphors, which in particular can be used to emit light of a particular color with a comparatively small spectral width, adjustable by means of the size of the quantum dots. It is likewise possible for the phosphor to be grown epitaxially and to be formed by a multi-quantum well structure. Epitaxially grown phosphors for photoluminescence are based, for example, on the same semiconductor material systems as the semiconductor layer sequence for the image points and pixels.

According to at least one embodiment, the subpixels within the pixels are each of the same size as seen in plan view. This means that the subpixels preferably have the same base area as seen in plan view. For example, the subpixels are all formed by squares of equal size or equally large rectangles or equally large regular hexagons.

According to at least one embodiment, the subpixels within the pixels have different sizes when viewed in plan view. In this case, the subpixels can each have the same geometric basic shape, for example, square, rectangular, triangular or regular hexagonal.

According to at least one embodiment, at least three subpixels of different sizes are present per pixel. Said subpixels preferably have a size ratio of 4:2:1 when viewed in a plan view. This means that the light-emitting surfaces of the subpixels are halved in each case. In this way, a particularly high dynamic range can be achieved with comparatively simple control.

According to at least one embodiment, the display device comprises a support. The image points are arranged on the support. Furthermore, the image points are supplied with current via the support. For example, the support is a circuit board, in particular a printed circuit board, PCB for short. It is possible for the support to extend integrally and continuously over the entire display device. Alternatively, the support is composed of a plurality of partial supports which can be arranged laterally adjacent to one another.

According to at least one embodiment, a thin-film transistor arrangement is located on a side of the support facing the image points. The image points and thus also the pixels and the subpixels are electrically controlled by means of the thin-film transistor arrangement.

According to at least one embodiment, the display device comprises one or more intermediate carriers. The at least one intermediate carrier is preferably mounted on the support.

According to at least one embodiment, the image points are each mounted on the intermediate carriers. This means that the intermediate carriers can be located between the image points and the support.

According to at least one embodiment, the at least one intermediate carrier is based on silicon. The intermediate carrier preferably comprises a drive circuit. The drive circuit is preferably realized by CMOS circuits and can comprise transistors, memory units, registers and/or constant current sources. For this purpose, the intermediate carrier is preferably based on silicon or alternatively on another semiconductor material.

According to at least one embodiment, exactly one image point with all its subpixels is present per intermediate carrier. In this way, the intermediate carriers with the image points can be mounted on the support with great design freedom. This applies, in particular, if the display device is designed as a video wall.

According to at least one embodiment, a plurality of the image points with all their respective subpixels are present per intermediate carrier. This means that the image points can be grouped or pre-grouped by means of the intermediate carriers and can be correspondingly mounted in groups on the support. The intermediate carriers are designed, for example, as square or rectangular fields. The intermediate carriers can likewise be produced as individual columns or column sections or also as individual rows or line sections. It is possible for all intermediate carriers which are mounted on the support to be structurally identical. The intermediate carriers can be applied identically or differently in relation to one another. For example, different intermediate carriers can be used for corner regions or inner regions or edge regions of the display device, viewed in a plan view.

According to at least one embodiment, all subpixels within a pixel and/or all pixels within an image point each have a common and/or continuous active zone of the respective semiconductor layer sequence. This means that the pixels and/or the image points can be monolithically embodied with regard to the semiconductor layer sequence.

Alternatively, it is possible for the subpixels of the respective pixel or of the respective image point to be produced from the same semiconductor layer sequence. In this case, a subdivision into the subpixels is effected in particular by complete removal of the semiconductor layer sequence between adjacent subpixels, in particular by means of etching. In this case, when dividing the semiconductor layer sequence, a relative position of the subpixels relative to one another preferably does not change.

This means that the subpixels can have the same semiconductor layer sequence. This can be detected, for example, by transmission electron microscopy, since the subpixels have the same layering within the semiconductor layer sequence and the same layer thicknesses. A layering and precise layer thicknesses of the individual partial layers of the semiconductor layer sequence are a type of fingerprint, by which it is possible to determine whether the subpixels are actually based on the same semiconductor layer sequence.

According to at least one embodiment, the display device is configured for displaying films in the video format 4K and/or UHD. In other words, it can be a 4K2K display. In the 4K format, in particular 4096 times 2160 RGB image points are present. In the UHD format, also referred to as Ultra High Definition, 3840 times 2160 RGB image points are present.

According to at least one embodiment, the display device is designed to display high-contrast images, also referred to as HDR. HDR images are coded, for example, with at least 10 bits for the brightness, preferably with at least 12 bits or 14 bits or 15 bits. The brightness coding can be carried out linearly or non-linearly. By contrast, digital images have a low dynamic range, also referred to as low dynamic range images or LDR images for short; usually, such a brightness coding has a depth of 7 bits or 8 bits only.

The invention further relates to an operating method for such a display device. The display device is designed as described in connection with one or more of the above-mentioned embodiments. Features of the operating method are therefore also disclosed for the display device and vice versa.

In at least one embodiment of the operating method, the image points of the display device are operated at least at times such that not all of the subpixels per pixel emit light, but only one or more of the subpixels. As a result, an increased contrast ratio can be achieved during operation, compared to an otherwise identical display device without dividing the pixels into subpixels.

According to at least one embodiment, the image points and thus the pixels and subpixels are operated with pulse width modulation. The pulse width modulation is used without current strength variation. This means that the current intensity is equal in the pulses of the pulse width modulation. This relates in particular to an equilibrium current intensity or maximum current intensity in the respective current pulses. No specific variation or adjustment of the current intensities occurs over different pulses. In particular, the same constant current source can be used unchanged for a nominally constant current intensity.

BRIEF DESCRIPTION OF THE DRAWINGS

A display device described here and an operating method described here are explained in more detail below with reference to the drawing on the basis of exemplary embodiments. Identical reference signs indicate the same elements in the individual figures. However, no relationships to scale are illustrated, but rather individual elements can be represented with an exaggerated size in order to afford a better understanding.

In the Figures:

FIG. 2, collectively

FIG. 8, collectively

FIG. 9, collectively FIG. 10, collectively

DETAILED DESCRIPTION OF ILLUSTRATIVE EMBODIMENTS

Figure 1:
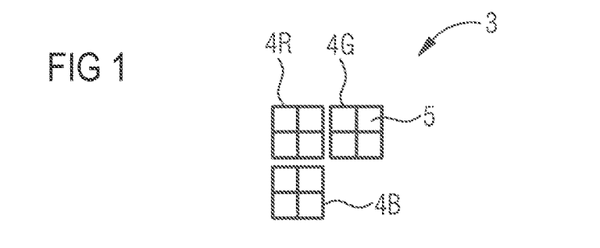
FIG. 1 shows a schematic plan view of an exemplary embodiment of an image point for display devices.

FIG. 1 shows an exemplary embodiment of an image point 3 for a display device 1. The image point 3 has three pixels 4R, 4G, 4B for generating red, green and blue light. The pixels 4R, 4G, 4B are each square in plan view and are arranged at three corner regions of a square.

The pixels 4R, 4G, 4B are each divided into a plurality of subpixels 5. In particular, four of the subpixels 5 are present in each case. Viewed in a plan view, the subpixels 5 are all of the same size and have a square shape. The square pixels 4R, 4G, 4B are thus divided into four squares of equal size by the subpixels 5.

It is thus possible to operate the individual pixels 4R, 4G, 4B in such a way that at low light intensities only one of the subpixels 5 of the associated pixel 4R, 4G, 4B is supplied with current. Hence, an unchanged current intensity can be used and a minimum pulse duration of a PWM control can be selected to be comparatively large. Displaying of high-contrast images, HDR images for short, can be efficiently realized with such image points 3.

In contrast, conventional image points 3' are shown in FIG. 2. In this case, the individual pixels 4R, 4G, 4B are not subdivided into subpixels. Thus, the individual pixels 4R, 4G, 4B have comparatively large areas. For low light intensities, therefore, either the current intensities are to be reduced, which can lead to an uncontrolled and/or non-linear behavior at low currents, or it is technically complex to realize only very short minimum switch-on times in the PWM.

Figure 2A:
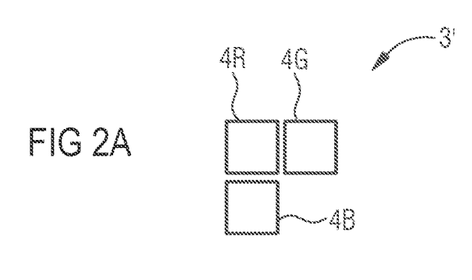
FIGS. 2A to 2B, shows schematic plan views of conventional image points.
Figure 2B:
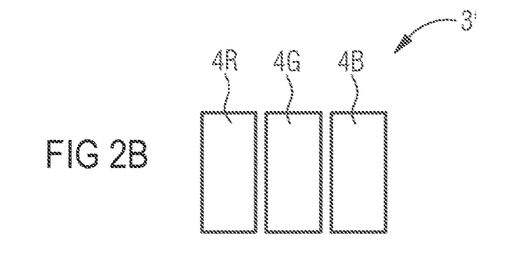

The image points 3' can be designed to be square, see FIG. 2A and see FIG. 1, or as rectangles, see FIG. 2B.

Figure 3:
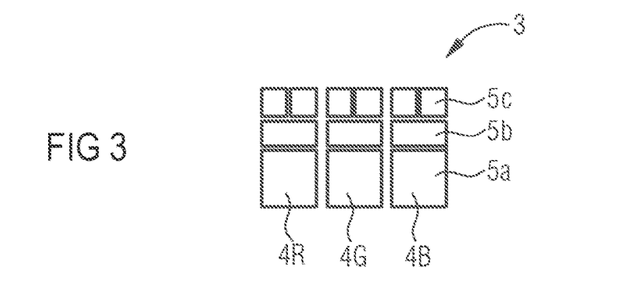
FIG. 3 shows a schematic plan view of an exemplary embodiment of an image point for display devices.

FIG. 3 shows a further exemplary embodiment of an image point 3. Like in FIG. 2B, when seen in plan view, the pixels 4R, 4G, 4B have a rectangular contour line. A plurality of subpixels 5a, 5b, 5c of different sizes are present per pixel 4R, 4G, 4B, for example, in each case four of the subpixels 5a, 5b, 5c. The subpixels 5a, 5b are comparatively large and are each designed to be rectangular. The smallest subpixels 5c are square in plan view. A size ratio of the subpixels 5a, 5b, 5c to one another is approximately 4:2:1.

In this way, particularly small brightnesses can be achieved by driving only at least one of the subpixels 5c.

Figure 4:
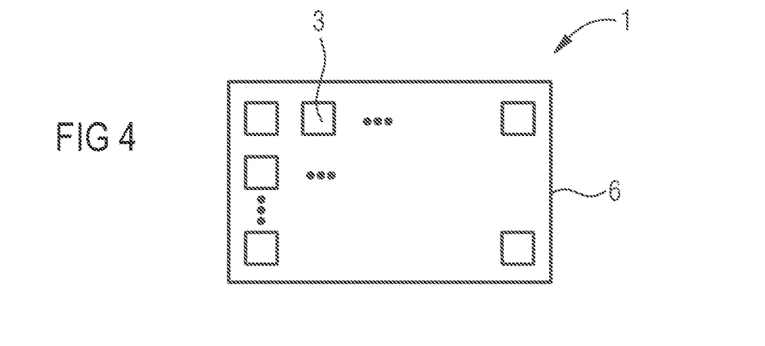
FIG. 4 shows a schematic plan view of an exemplary embodiment of a display device.

FIG. 4 shows an exemplary embodiment of a display device 1. The image points 3 are arranged in the shape of a matrix with a regular square or rectangular pattern on a support 6. The support 6 is, for example, a printed circuit board. The individual image points 3 are preferably constructed as illustrated in FIG. 3, as an alternative as illustrated in FIG. 1.

The display device is preferably 4K-compatible and has approximately 4000×2000 of the image points 3. The image points 3 can be electrically controlled independently of one another. The image points 3 are driven via the support 6.

Figure 5:
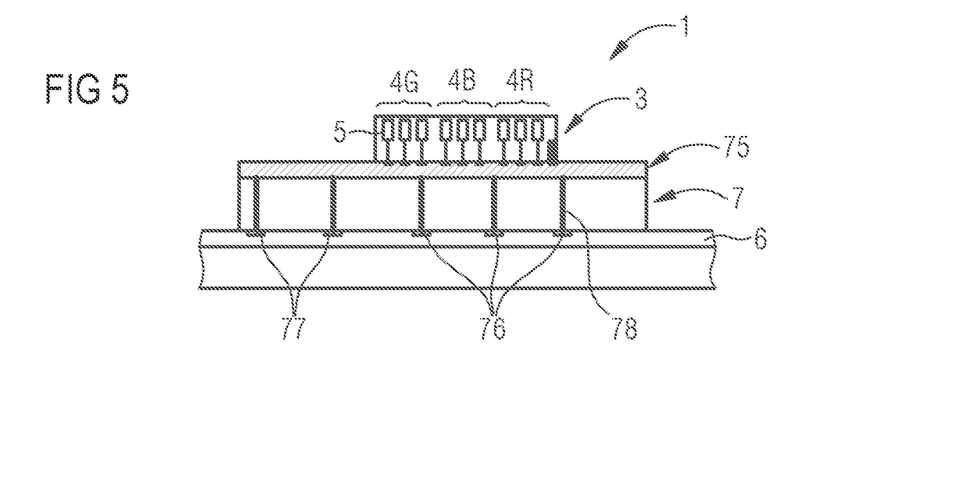
FIGS. 5 to 7 show schematic sectional representations of exemplary embodiments of display devices.

FIG. 5 shows a further exemplary embodiment of a display device 1, wherein only one of the image points 3 is illustrated in order to simplify the representation. The image point 3 is formed by an LED chip, as is also possible in all other exemplary embodiments. The individual subpixels 5 of the pixels 4G, 4B, 4R for generating green, blue and red light are monolithically integrated in the LED chip for the image point 3.

The LED chip for the image point 3 is mounted on an intermediate carrier 7. The intermediate carrier 7 is based on silicon and comprises a drive circuit 75. The drive circuit 75 is produced in CMOS technology in a layer of the intermediate carrier 7 closest to the LED chip. The individual subpixels 5 can thus be electrically addressed and controlled via the control circuit 75 of the intermediate carrier 7.

The intermediate carrier 7 is located on the support 6. For this purpose, the intermediate carrier 7 and the support 6 have a plurality of electrical connection surfaces 76, 77. For example, three connection surfaces 76 are provided for supplying energy to the intermediate carrier 7 and to the image point 3. In addition, two connection surfaces 77 for a data line are provided, for example.

The intermediate carrier 7 can thus obtain control data via the connection surfaces for the data line 77, the control data being processed in the control circuit 75. The subpixels 5 are driven in accordance with the control data via the data line 77.

An electrical connection between the connection surfaces 76, 77 and the drive circuit 75 is carried out, for example, by means of electrical contact pads 78. The electrical feedthroughs 78 are preferably plated-through holes through silicon, also referred to as Through Silicon Vias or TSVs for short.

For example, between the LED chip comprising the subpixels 5 and the drive circuit 75 there is one electrical connection more than there are subpixels 5. The LED chips with the subpixels 5 can be soldered or glued to the intermediate carrier 7, or, preferably, can also be attached by means of direct bonding or wafer bonding. Direct bonding or wafer bonding is used, in particular, if the LED chip with the subpixels 5 is designed as a substrateless chip without a growth substrate and then has, for example, a thickness of at least 2 μm and/or at most 12 μm.

Figure 6:
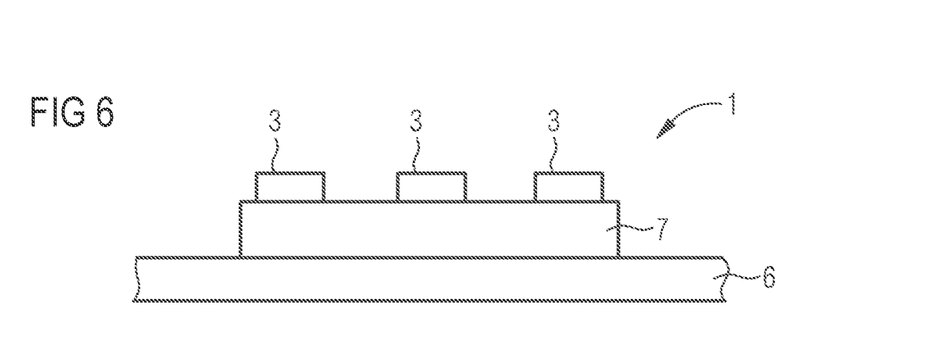

In the exemplary embodiment of FIG. 6 it is illustrated that a plurality of the image points 3 are mounted jointly on the intermediate carrier 7. In this way, wiring and the number of conductor tracks on the support 6 can be reduced. Wiring takes place in an intensified manner via the intermediate carrier 7. In FIG. 6, a contacting between the support 6 and the intermediate carrier 7 can also be realized in the configuration in accordance with FIG. 5; as a result of the presence of the connection surfaces 77 for the data line, only a relatively small number of connection surfaces 76, 77 between the support 6 and the intermediate carriers 7 is required.

Figure 7:
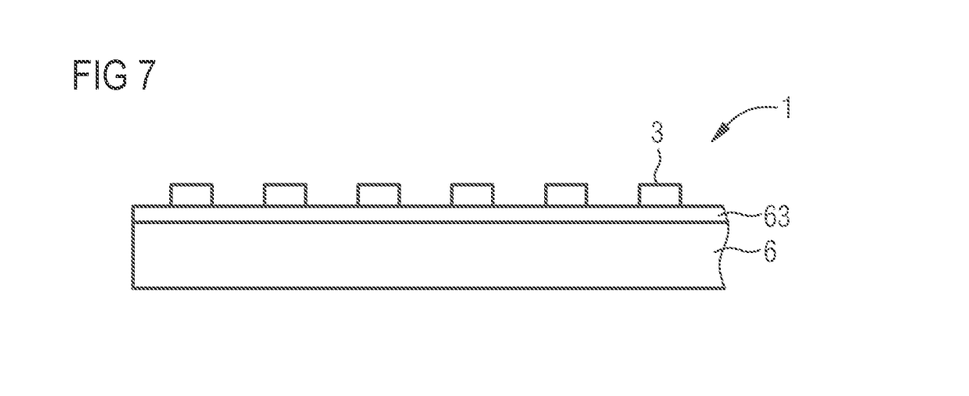

In the exemplary embodiment of FIG. 7, it is illustrated that a thin-film transistor arrangement 63 is attached to the support 6 or is part of the support 6. The image points 3 are electrically controlled via the thin-film transistor arrangement 63. The image points 3 may thus be attached directly to the support 6.

In the exemplary embodiments as illustrated in FIG. 8, the image points 3, in particular in the form of LED chips, are located directly on the support 6. The same applies to the drive circuits 75. The image points 3 and the associated control circuits 75 can thus lie in a common plane parallel to the support 6.

Figure 8A:
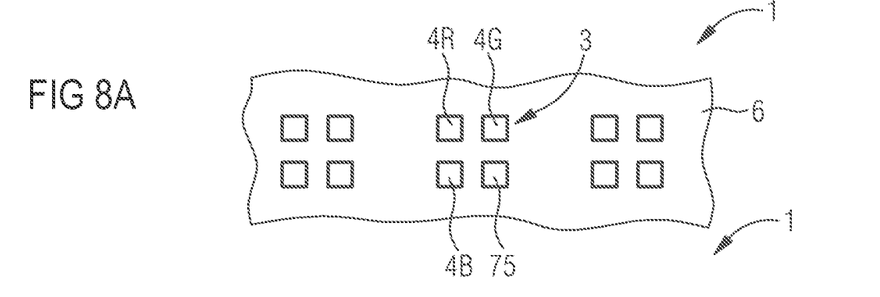
FIGS. 8A to 8C, shows schematic plan views of exemplary embodiments of display devices.

FIG. 8A illustrates that the pixels 4R, 4G, 4B are arranged in accordance with FIG. 1 and are thus located at corner regions of a square, viewed per image point 3. The associated drive circuit 75 for this image point 3 is located at a fourth corner region. One drive circuit 75 can thus be present per image point 3.

Furthermore, FIG. 8A illustrates that a distance between adjacent image points 3 can be greater than between the pixels 4R, 4G, 4B within the image points 3. The same applies to all other exemplary embodiments. Alternatively, the pixels 4R, 4G, 4B can be arranged equidistantly over a plurality of image points 3, in order to realize a space-saving arrangement.

Figure 8B:
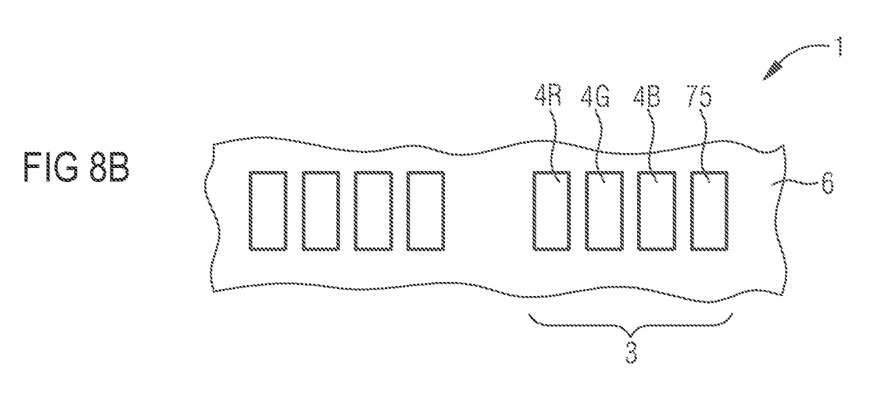

FIG. 8B shows that the pixels 4R, 4G, 4B, viewed in plan view, are each designed to be rectangular and are arranged linearly. The respectively associated control circuit 75 joins into this linear arrangement.

Figure 8C:
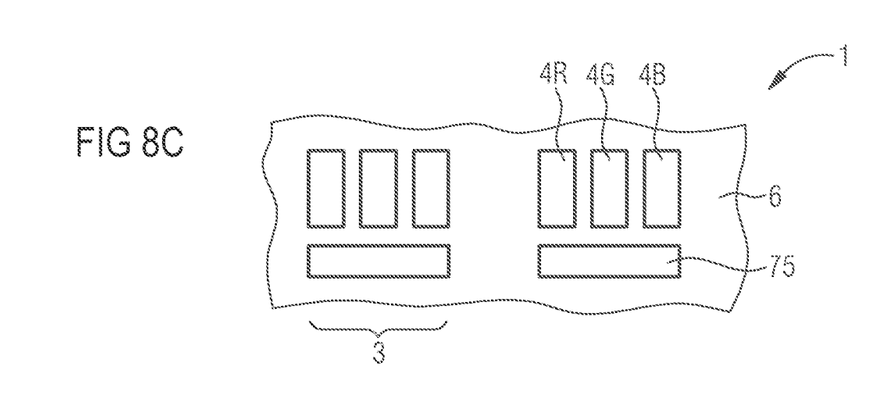

In the display device 1 of FIG. 8C, the pixels 4R, 4G, 4B are arranged linearly. The associated control circuit 75 can likewise be rectangular, seen in plan view, and extends along the associated pixels 4R, 4G, 4B.

Corresponding arrangements, as illustrated in FIG. 8, can also be present in all other exemplary embodiments.

Figure 9A:
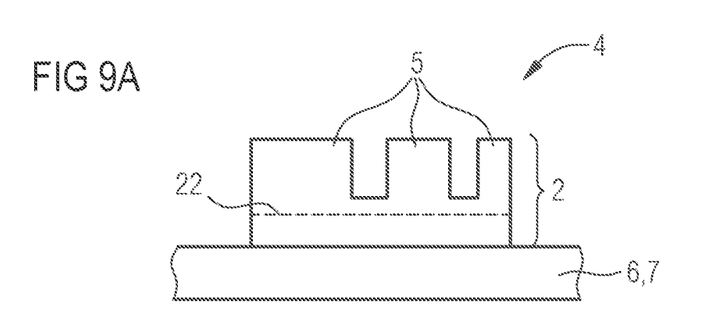
FIGS. 9A to 9B, shows schematic sectional representations of exemplary embodiments of pixels for display devices.

In the exemplary embodiments of the pixels 4 as can be seen in FIG. 9, the pixels 4 are each produced from a single semiconductor layer sequence 2. According to FIG. 9A, an active zone 22 of the semiconductor layer sequence 2 extends continuously over all subpixels 5. The semiconductor layer sequence 2 is partially removed between adjacent subpixels 5 so that the subpixels 5 can be controlled electrically independently of one another and no or no significant electrical transverse conductivity occurs between adjacent subpixels 5 within the semiconductor layer sequence 2. For this purpose, it is also possible that, in contrast to the illustration in FIG. 9A, the active zone 22 is severed, wherein the semiconductor layer sequence 2 is retained as a coherent layer sequence.

Figure 9B:
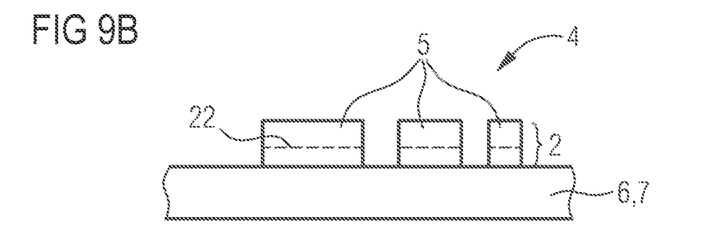

In contrast, according to FIG. 9B the semiconductor layer sequence 2 is completely removed between adjacent subpixels 5. During the production of the subpixels 5, their relative position with respect to one another during attachment to the support 6 or the intermediate carrier 7 is not changed in comparison with a growth substrate. The semiconductor layer sequence thus extends in unchanged, constant form over the subpixels 5, ignoring the gaps between the subpixels 5.

The gaps between adjacent subpixels 5 amount preferably to at least 0.2 μm or 0.5 μm or 1 μm and/or to at most 10 μm or 5 μm or 2 μm. This preferably also applies to all other exemplary embodiments.

In the exemplary embodiments of the image points 3 of FIG. 10, the image points 3 each comprise at least one phosphor 45. Radiation generated in the associated active zone 22 is preferably completely converted into light of another color by means of the phosphor 45.

Figure 10A:
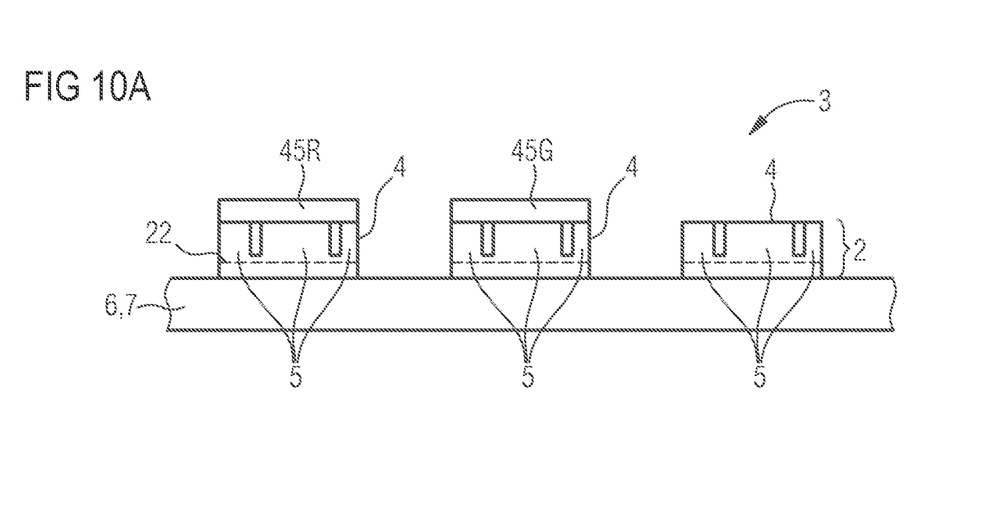
FIGS. 10A to 10C, shows schematic sectional representations of exemplary embodiments of image points for display devices.

According to FIG. 10A, the pixels 4 have the same semiconductor layer sequence 2, in which preferably blue light is generated. A subdivision into the subpixels 5 is provided by partially removing the semiconductor layer sequence 2, analogously to FIG. 9A.

The phosphors 45R, 45G are continuously applied to the pixels 4 for generating red and green light. The phosphors 45R, 45G for generating red and green light are, for example, quantum dots, which are introduced into a matrix material. Deviating from the representation in FIG. 10A, the phosphors can also extend into the gaps between adjacent subpixels 5.

Figure 10B:
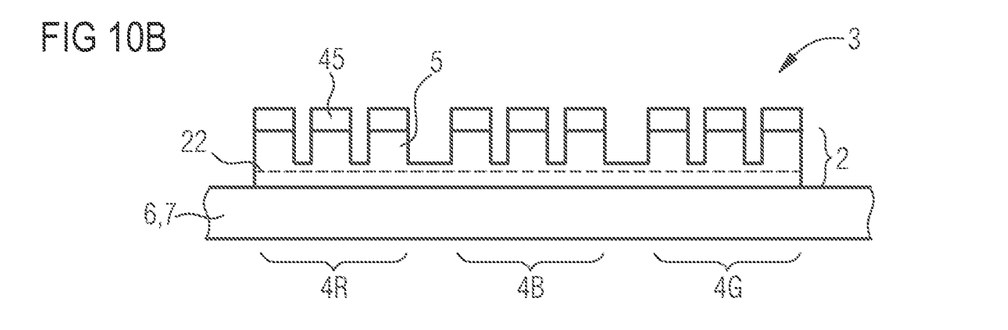

FIG. 10B illustrates that the semiconductor layer sequence 2, and optionally also the active zone 22, extends continuously over the entire image point 3. Alternatively, this is also possible over several of the image points 3, unlike what is shown in FIG. 10B. Near ultraviolet radiation, for example, is generated in the active zone 22. In this way, a total of three different phosphors 45 are present in order to generate red, green and blue light.

As in all exemplary embodiments, it is also possible for the phosphors 45 to be restricted to individual subpixels 5 in each case. In this configuration, the phosphor 45 can be realized by layers grown epitaxially on the semiconductor layer sequence 2; said phosphor layers can be structured together with subdividing the semiconductor layer sequence 2 into the subpixels 5.

Figure 10C:
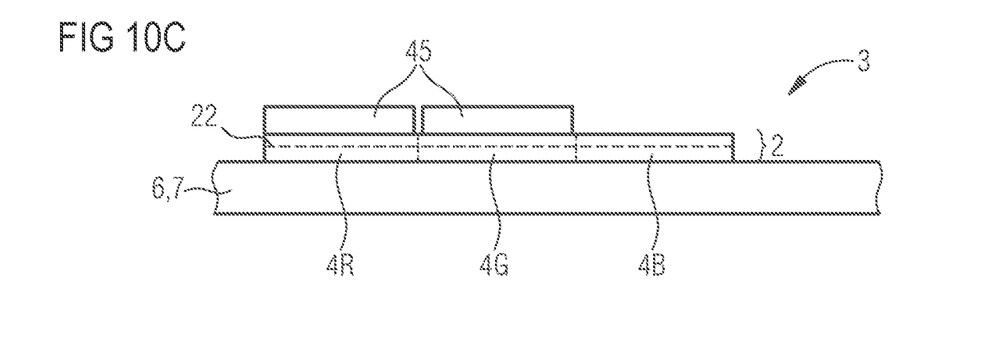

FIG. 10C illustrates that the semiconductor layer sequence 2 extends over all the pixels 4R, 4G, 4B in a uniform thickness. This is made possible, for example, by a comparatively low electrical transverse conductivity in the semiconductor layer sequence 2. The subdivision into the subpixels, not represented In FIG. 10C, is then carried out, for example, purely electrically and not geometrically by means of partial splitting of the semiconductor layer sequence 2 through material removal. The phosphors 45 can be applied to the corresponding pixels 4R, 4G, 4B in a planar and continuous manner.

As in all the exemplary embodiments, it is also possible that between adjacent pixels 4R, 4G, 4B an optical insulation is introduced, for example, by diffusely reflecting casting materials or by specularly reflecting metals, for example, in trenches in the semiconductor layer sequence 2 and/or between adjacent regions of the phosphors 45.

The image points 3 described here can be controlled with regard to a brightness, for example, with a 10-bit dimming, in order to achieve a high brightness dynamic range. It is possible for the 10-bit control to be obtained from an 8-bit data set or a 7-bit data set by means of expansion or interpolation in order to extend the brightness range.

The components shown in the figures follow, unless indicated otherwise, preferably in the specified sequence directly one on top of the other. Layers which are not in contact in the figures are preferably spaced apart from one another. If lines are drawn parallel to one another, the corresponding surfaces are preferably likewise oriented parallel to one another. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or in the exemplary embodiments.

What is claimed is:

1. A display device comprising:
a plurality of image points configured for emitting visible light of adjustable color by at least one semiconductor layer sequence,
wherein the image points are independently controllable of one another,
wherein each of the image points comprises a plurality of types of pixels and each type of pixel is configured to emit light of a particular color,
wherein the pixels are independently controllable of one another,
wherein each of the pixels is divided into a plurality of subpixels, the subpixels being independently controllable of one another within the associated pixel,
wherein all subpixels of the associated pixel are configured for emitting light of the same color from the display device without further color change,
wherein the subpixels within the pixels, viewed in plan view, have different sizes, and
wherein at least three subpixels of different sizes are present per pixel and these subpixels, viewed in the plan view, have a size ratio of 4:2:1.

2. The display device according to claim 1, wherein all subpixels within a pixel and/or all pixels within an image point have a common and continuous active zone of the respective semiconductor layer sequence.

3. The display device according to claim 1, wherein the display device is configured for displaying films in at least one of video formats 4K or UHD.

4. The display device according to claim 1, wherein each image point comprises a pixel for generating red light, a pixel for generating green light and a pixel for generating blue light.

5. The display device according to claim 4, wherein each different type of pixel of the semiconductor layer sequence has an active zone for generating the light of the respective color so that the red, green and blue light is generated in operation by electroluminescence.

6. The display device according to claim 4,
wherein the semiconductor layer sequence of the different types of pixels has a respectively identically designed active zone for generating light of only one particular color, and
wherein at least the red-emitting pixels and the green-emitting pixels are each connected to a phosphor so that at least the red light and the green light are generated in operation by photoluminescence.

7. The display device according to claim 1, further comprising a support on which the image points are arranged and via which the image points are supplied with current.

8. The display device according to claim 7, wherein, at a side of the support facing the image points, a thin-film transistor arrangement is located, and wherein the thin-film transistor arrangement is able to electrically control the image points.

9. The display device according to claim 7, further comprising a plurality of intermediate carriers mounted on the support, wherein the image points are each mounted on the intermediate carriers such that the intermediate carriers are arranged between the pixels and the support, and wherein the intermediate carriers are based on silicon and each comprises a control circuit for the subpixels.

10. The display device according to claim 9, wherein exactly one image point with all its respective subpixels is present per intermediate carrier.

11. The display device according to claim 9, wherein a plurality of the image points with all their respective subpixels is present per intermediate carrier.

12. An operating method for a display device according to claim 1, the method comprising:
operating the image points at least at times in such a way that not all of the subpixels per pixel generate light so that an increased contrast ratio can be achieved during operation compared to a display device without dividing the pixels into subpixels.

13. The operating method according to claim 12, wherein the image points are operated with a pulse width modulation and without a current strength variation.

* * * * *